(12) United States Patent
Hecht

(10) Patent No.: US 9,779,868 B2
(45) Date of Patent: Oct. 3, 2017

(54) COMPACT IMPEDANCE TRANSFORMER

(71) Applicant: RF Micro Devices, Inc., Greensboro, NC (US)

(72) Inventor: James Burr Hecht, Cedar Rapids, IA (US)

(73) Assignee: Qorvo US, Inc., Greensboro, NC (US)

( * ) Notice: Subject to any disclaimer, the term of this patent is extended or adjusted under 35 U.S.C. 154(b) by 119 days.

(21) Appl. No.: 14/701,257

(22) Filed: Apr. 30, 2015

(65) Prior Publication Data
US 2015/0318107 A1    Nov. 5, 2015

Related U.S. Application Data

(60) Provisional application No. 61/986,453, filed on Apr. 30, 2014.

(51) Int. Cl.
*H01F 27/34* (2006.01)
*H01F 19/04* (2006.01)
(Continued)

(52) U.S. Cl.
CPC ......... *H01F 19/04* (2013.01); *H01F 27/2804* (2013.01); *H01F 27/34* (2013.01);
(Continued)

(58) Field of Classification Search
CPC ...... H01F 19/04; H01F 27/34; H01F 27/2804; H01F 27/40; H03H 7/38; H03H 7/42;
(Continued)

(56) References Cited

U.S. PATENT DOCUMENTS 4,658,262 A * 4/1987 DuHamel ............. H01Q 11/10
343/792.5
4,725,792 A * 2/1988 Lampe, Jr. ............. H01P 5/10
333/128
(Continued)

OTHER PUBLICATIONS

Liu, Shih-Ping, "Planar transmission line transformer using coupled microstrip lines," 1998 IEEE MTT-S International Microwave Symposium Digest, vol. 2, pp. 789-792.
(Continued)

*Primary Examiner* — Zeev V Kitov
(74) *Attorney, Agent, or Firm* — Withrow & Terranova, P.L.L.C.

(57) ABSTRACT

A compact impedance transformer is disclosed having a first dielectric substrate, a first planar conductor disposed on a top surface of the first dielectric substrate in a loop, a second planar conductor disposed on a bottom surface of the first dielectric substrate in a second loop, wherein the first planar conductor and the second planar conductor are substantially identical and in stacked alignment. A second dielectric substrate has a third planar conductor disposed on a top surface of the second dielectric substrate in a third loop, and a fourth planar conductor disposed on a bottom surface of the second dielectric substrate in a fourth loop, wherein the third planar conductor and the fourth planar conductor are substantially identical and in stacked alignment. An interconnect structure between terminals of the first planar conductor, the second planar conductor, the third planar conductor, and the fourth planar conductor provide impedance transformations.

19 Claims, 13 Drawing Sheets

(51) Int. Cl.
*H03H 7/38* (2006.01)
*H01F 27/28* (2006.01)
*H03H 7/42* (2006.01)
*H03H 7/01* (2006.01)
*H01P 3/08* (2006.01)
*H01P 5/02* (2006.01)
*H01F 27/40* (2006.01)

(52) U.S. Cl.
CPC ............. *H01F 27/40* (2013.01); *H01P 3/082* (2013.01); *H01P 5/028* (2013.01); *H03H 7/0115* (2013.01); *H03H 7/38* (2013.01); *H03H 7/42* (2013.01); *H03H 7/425* (2013.01); *H01F 2027/2809* (2013.01)

(58) Field of Classification Search
CPC ...... H03H 7/0115; H03H 7/425; H01P 3/082; H01P 5/028
See application file for complete search history.

(56) References Cited

U.S. PATENT DOCUMENTS

| | | | | | |
|---|---|---|---|---|---|
| 5,206,611 | A | * | 4/1993 | Russell | H01P 5/12 333/127 |
| 5,945,890 | A | * | 8/1999 | McCorkle | H01P 5/10 333/128 |
| 6,097,273 | A | * | 8/2000 | Frye | H01F 5/003 333/25 |
| 2002/0097110 | A1 | * | 7/2002 | Khan | H01P 5/028 333/34 |
| 2002/0163375 | A1 | * | 11/2002 | Wu | H01L 27/0617 327/356 |
| 2006/0061431 | A1 | * | 3/2006 | London | H01P 5/02 333/33 |
| 2011/0221561 | A1 | * | 9/2011 | Mori | H01F 17/0013 336/200 |
| 2014/0240059 | A1 | * | 8/2014 | Bradley | H03H 7/42 333/133 |

OTHER PUBLICATIONS

Post, J. E., "Analysis and design of planar, spiral-shaped, transmission-line transformers," IEEE Trans. on Advanced Packaging, vol. 30, No. 1, Feb. 2007, pp. 104-114.

Horn, Johannes et al., "Ultra broadband transmission line transformers—planar realization principles," 15th International Conference on Microwaves, Radar and Wireless Communications, 2004, Mikon-2004, vol. 1, pp. 225-228.

Xiang, Zhou et al., "Design of broadband impedance transformer using coupled microstrip transmission lines," 2009 3rd IEEE International Symposium on Microwave, Antenna, Propagation and EMC Technologies for Wireless Communications, pp. 994-997.

* cited by examiner

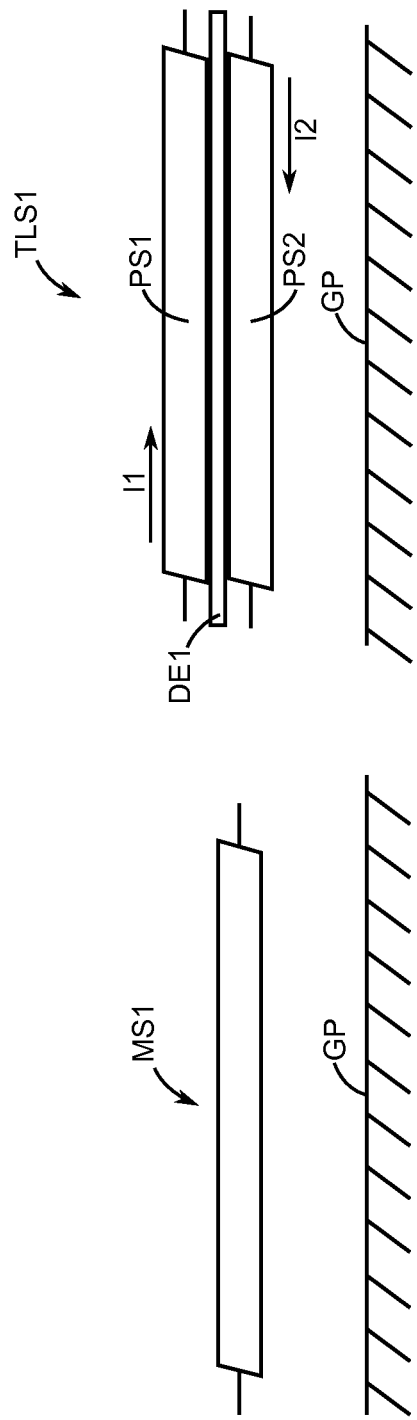

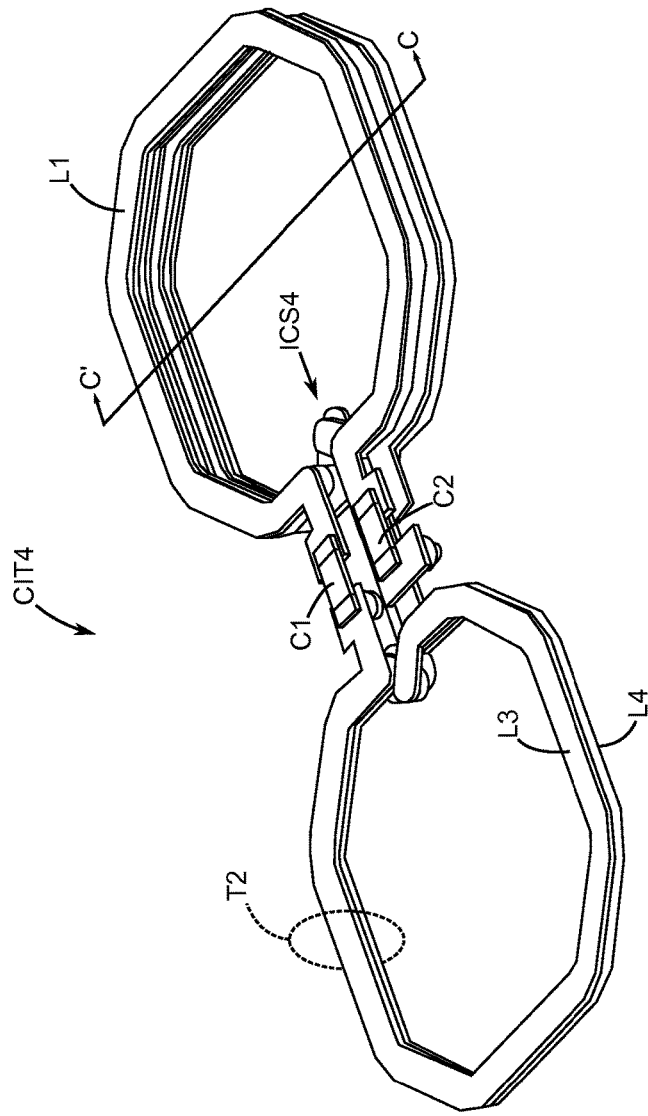
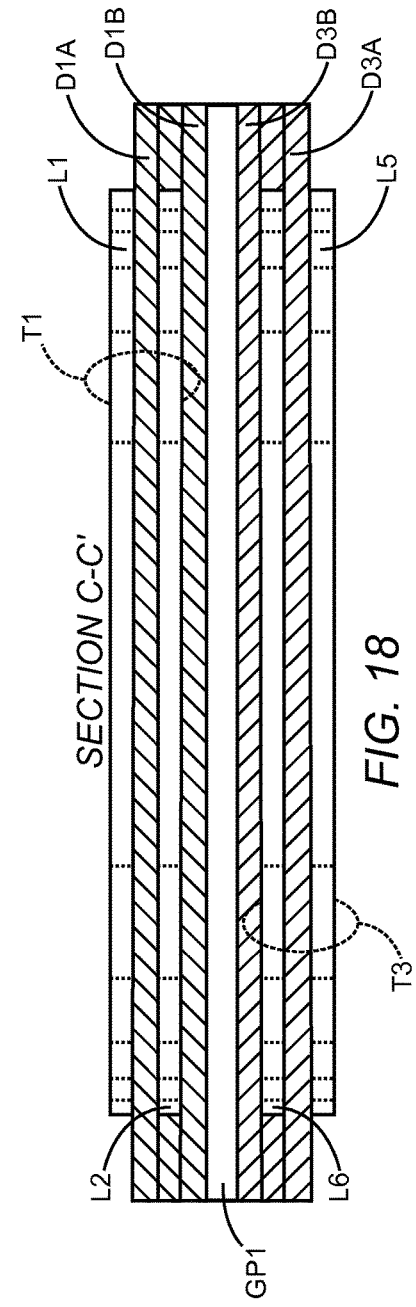
FIG. 17
FIG. 18

| IMPEDANCE TRANSFORMATION RATIO | C1, pF | C2, pF | F0, MHz | INSERTION LOSS, dB | SIZE, μm LENGTH X WIDTH |
|---|---|---|---|---|---|
| 4:1 | 1.0 | NONE | 1800 | 0.135 | 3170 x 1400 |
| 4:1 | 1.0 | 1.5 | 1800 | 0.315 | 1800 x 1250 |
| 4:1 | 1.2 | 1.2 | 1800 | 0.288 | 1750 x 1200 |
| 9:1 | 1.8 | 2.7 | 1800 | 0.167 | 3170 x 1400 |
| 9:1 | 2.4 | 5.6 | 1800 | 0.471 | 1800 x 1250 |
| 9:1 | 3.0 | 6.5 | 900 | 0.244 | 5240 x 2400 |
| 2.25:1 | 0.4 | 0.5 | 3600 | 0.505 | 3100 x 1150 |
| 2.25:1 | 0.7 | 1.0 | 1800 | 0.549 | 4900 x 2050 |
| 6.25:1 | 0.9 | NONE | 3600 | 0.309 | 3050 x 1100 |
| 6.25:1 | 2.0 | 1.2 | 1800 | 0.366 | 4850 x 2000 |

COMPACT IMPEDANCE TRANSFORMER

RELATED APPLICATIONS

This application claims the benefit of U.S. provisional patent application No. 61/986,453, filed Apr. 30, 2014, the disclosure of which is incorporated herein by reference in its entirety.

FIELD OF THE DISCLOSURE

The disclosure relates generally to radio frequency (RF) transmission line transformers.

BACKGROUND

Transformers are an important component used in radio frequency (RF) circuitry. They can be used in filter circuits, in impedance matching circuits, and in transforming balanced to unbalanced (balun) circuits. Lower RF applications (low hundreds of megahertz (MHZ) traditionally use windings on a ferrite core, with the square of the ratio of primary to secondary windings $(N_p/N_s)^2$ representing an impedance ratio $(Z_p/Z_s)$. The power is transferred through the ferrite core. Higher RF applications (high hundreds of MHz to low gigahertz (GHz) often use transmission line transformers. The transmission lines may be implemented as coaxial cables or twisted enameled wires. In this case, the power is transferred through the dielectric medium of the transmission line. The characteristic impedance of the transmission line is critical in obtaining optimum performance of the transformer. In order to extend the lower frequency operation of transmission line transformers, the transmission line or lines may be wound on a ferrite core.

Further still, in order to achieve certain impedance transformations using transmission line transformers, the output of one or more transmission lines may be connected to the input of one or more transmission lines. Such a case is shown in FIG. 1, which shows the connections necessary to achieve a 9:1 impedance transformation. The transmission line transformer of FIG. 1 is made up of a first transmission line T1' and a second transmission line T2'. The first transmission line T1' is a coaxial cable having a first center conductor L1' with a first input terminal IN1' at one end and a first output terminal OUT1' at another end. A first outer conductor L2' provides electrical shielding for the first center conductor L1'. The second transmission line T2' is another coaxial cable having a second center conductor L3' with a second input terminal IN2' at one end and a second output terminal OUT2' at another end. A second outer conductor L4' provides electrical shielding for the second center conductor L3'.

A first electrical interconnector E1' couples a first point P1' located on the first outer conductor L2' proximal to the first input terminal IN1' to a second point P2' located on the second outer conductor L4' proximal to the second output terminal OUT2'. A second electrical interconnector E2' couples a third point P3' located on the second outer conductor L4' proximal to the second input terminal IN2' to a fourth point P4' located on the first outer conductor L2' proximal to the first output terminal OUT1'. A third electrical interconnector E3' couples the second point P2' to a fifth point P5' that is electrically common with the first output terminal OUT1'. A fourth electrical interconnector E4' couples the fourth point P4' to a sixth point P6' that is electrically common with the second output terminal OUT2'. In this particular configuration, an input load impedance $R_L$ is transformed to an output load impedance of $R_L/9$, which is a 9:1 impedance transformation ratio. Other electrical interconnections provide different impedance ratios, such as 2.25:1, 4:1, and 6.25:1.

As a frequency of operation increases, it is important to make the connections shown in FIG. 1 as short as possible. Otherwise, parasitic properties of these connections will degrade the performance of the transformer. For this reason, the first transmission line T1' and the second transmission line T2' are often bent into a U-shape. Alternatively, if a first enamel-coated wire transmission line (not shown) and a second enamel-coated wire transmission line are twisted and wound on a ferrite core, the resulting windings are configured such that input and output connections of the first enamel-coated wire transmission line and the second enamel-coated wire transmission line are proximal to each other.

Transmission line transformers implemented using coaxial cable or twisted wire are relatively large compared with the physical size of typical handset power amplifiers and many other high-volume consumer electronics components. In addition, such implementations, especially if the implementation uses a ferrite core, are relatively costly. Since the ferrite core is used only to extend the low-frequency operation, and since the transmission line transformer transfers power through the dielectric medium, an implementation of such a transformer without a ferrite core is reasonable for handset power amplifier applications where a very broad bandwidth (e.g., a multi-octave bandwidth) is not required. However, as alluded to above, the physical size of coaxial cable is not suitable for integration into RF circuitry of wireless handsets such as smartphones. On the other hand, RF circuitry using printed circuit technology typically implements transmission lines as microstrip lines that are planar and take up a relatively small amount of space.

A schematic of a microstrip line MS1 is shown in FIG. 2. A number of papers in literature describe implementations of transmission line transformers using microstrip lines. As such, microstrip lines are usable to construct compact impedance transformers. However, traditional compact impedance transformers constructed using microstrip lines typically have a relatively difficult electrical connection methodology in comparison to typical transmission line transformers such as the one depicted in FIG. 1. A difficulty in using microstrip lines lies primarily in the fact that a return current path is a ground plane GP under the microstrip that is common to all transmission lines.

Referring back to FIG. 1, the input return current point of one transmission line cannot be distinctly connected to the output return current point of another transmission line because these connection points are already part of the ground plane. This difficulty applies particularly to transformers that require connections between the input and output terminals of the transformer. What is needed is a compact impedance transformer that does not require a common ground plane for output return current points.

SUMMARY

A compact impedance transformer is disclosed. The compact impedance transformer includes a first dielectric substrate with a first planar conductor disposed on a top surface of the first dielectric substrate in a first loop extending from a first-first terminal to a second-first terminal. A second planar conductor disposed on a bottom surface of the first dielectric substrate in a second loop extending from a first-second terminal to a second-second terminal, wherein the first planar conductor and the second planar conductor are substantially identical and in stacked alignment with the first dielectric substrate residing there between. Further included is a second dielectric substrate with a third planar conductor disposed on a top surface of the second dielectric substrate in a third loop extending from a first-third terminal to a second-third terminal. A fourth planar conductor is disposed on a bottom surface of the second dielectric substrate in a fourth loop extending from a first-fourth terminal to a second-fourth terminal, wherein the third planar conductor and the fourth planar conductor are substantially identical and in stacked alignment with the second dielectric substrate residing there between. An interconnect structure between terminals of the first planar conductor, the second planar conductor, the third planar conductor, and the fourth planar conductor provides impedance transformations.

Other embodiments include a third dielectric substrate with a fifth planar conductor disposed on a top surface of the third dielectric substrate in a fifth loop extending from a first-fifth terminal to a second-fifth terminal. Also included is sixth planar conductor disposed on a bottom surface of the third dielectric substrate in a sixth loop extending from a first-sixth terminal to a second-sixth terminal, wherein the fifth planar conductor and the sixth planar conductor are substantially identical and in stacked alignment with the third dielectric substrate residing there between.

Exemplary embodiments of the present compact impedance transformer have interconnect structure configurations that provide impedance transformation ratios of 2.25:1, 4:1, 6.25:1, and 9:1. However, it is to be understood that these ratios are only exemplary and that other ratios common to typical transmission line transformers are also available with the present compact impedance transformer. Various exemplary embodiments also include discrete capacitors coupled between select terminals of the planar conductors to reduce the width of the planar conductors while maintaining desired characteristic impedance for the planar conductors.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

FIG. 2 is a diagram of a related art microstrip type transmission line.

FIG. 3 is a diagram of a related art twin-lead type transmission line over a ground plane.

FIG. 17 is a three-dimensional structural diagram of the embodiment depicted in FIG. 16.

FIG. 18 is a sectional view of the embodiment of FIG. 17 taken along a section line C-C'.

FIG. 21 is a table providing capacitance values for the discrete capacitors, the operating frequency, the insertion loss, and the size of the exemplary compact impedance transformers for various exemplary impedance transformation ratios.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that when an element such as a layer, region, or substrate is referred to as being "over," "on," "in," or extending "onto" another element, it can be directly over, directly on, directly in, or extend directly onto the other element, or intervening elements may also be present. In contrast, when an element is referred to as being "directly over," "directly on," "directly in," or extending "directly onto" another element, there are no intervening elements present. It will also be understood that when an element is referred to as being "connected" or "coupled" to another element, it can be directly connected or coupled to the other element, or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

FIG. 3 depicts a transmission line system TLS1 that could be conveniently used to construct planar transmission line transformers. The transmission line system TLS1 is best considered as twin-lead over ground plane GP. In the transmission line system TLS1 a signal current I1 traverses a first planar strip PS1, and a return current I2 traverses a second planar strip PS2. The first planar strip PS1 and the second planar strip PS2 are spaced apart in vertically stacked planes. Although the ground plane GP is still present, power flow occurs in a dielectric DE1 that resides between the first planar strip PS1 and the second planar strip PS2. Note that current does not flow through the ground plane GP, as is the case for the conventional microstrip line MS1 shown in FIG. 2. The first planar strip PS1 and the second planar strip PS2 may be printed in a loop to allow an input terminal to be brought close to an output terminal, thus minimizing the length of interconnections needed for a particular transformer configuration.

Figure 1:
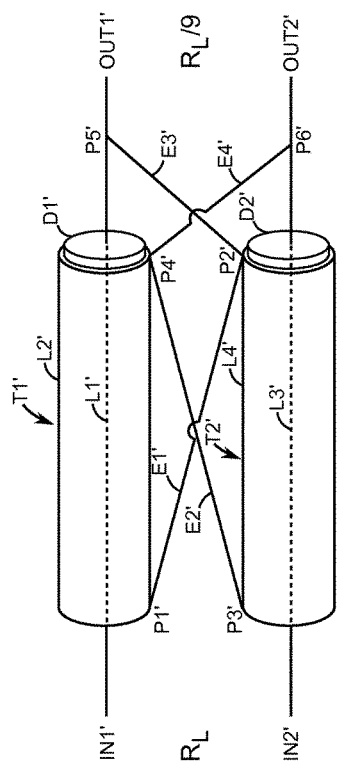
FIG. 1 is a diagram of a transmission line transformer that provides a 9:1 impedance transformation.
Figure 4:
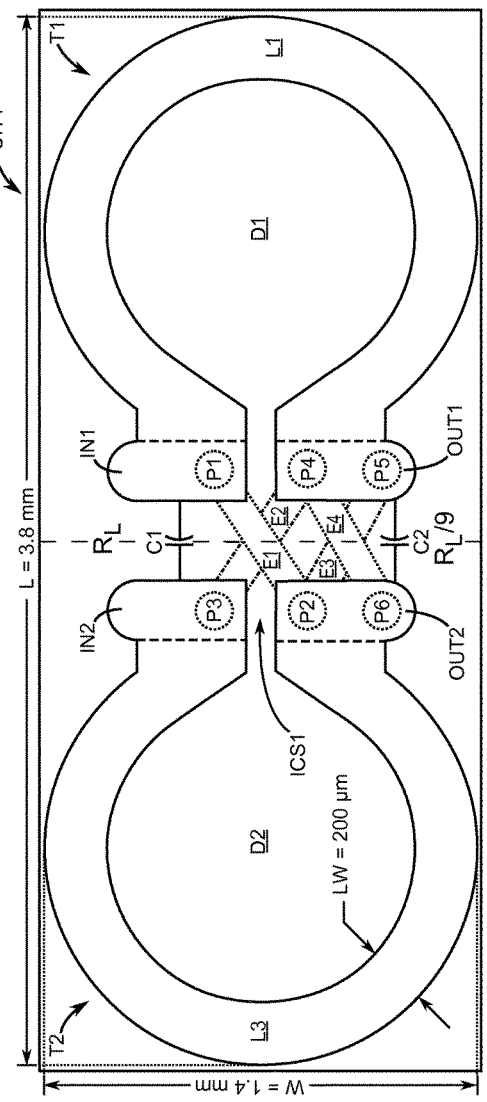
FIG. 4 is a top-side structural diagram of one embodiment of a compact impedance transformer that is electrically configured similar to the transmission line transformer of FIG. 1.

Refer back now to FIG. 1 for the purpose of aiding the discussion of FIG. 4, which is a top-side structural diagram of one embodiment of a compact impedance transformer CIT1 that is electrically configured similar to the transmission line transformer of FIG. 1. The primed element numbers of FIG. 1 represent similar items and references in FIGS. 4 to 8. For example, the element number L1 in FIG. 4 is functionally similar to element number L1' shown in FIG. 1.

The compact impedance transformer CIT1 includes a first dielectric substrate D1 with a first planar conductor L1 disposed on a top surface of the first dielectric substrate D1 in a loop extending from a first input terminal IN1 to a first output terminal OUT1.

Figure 5:
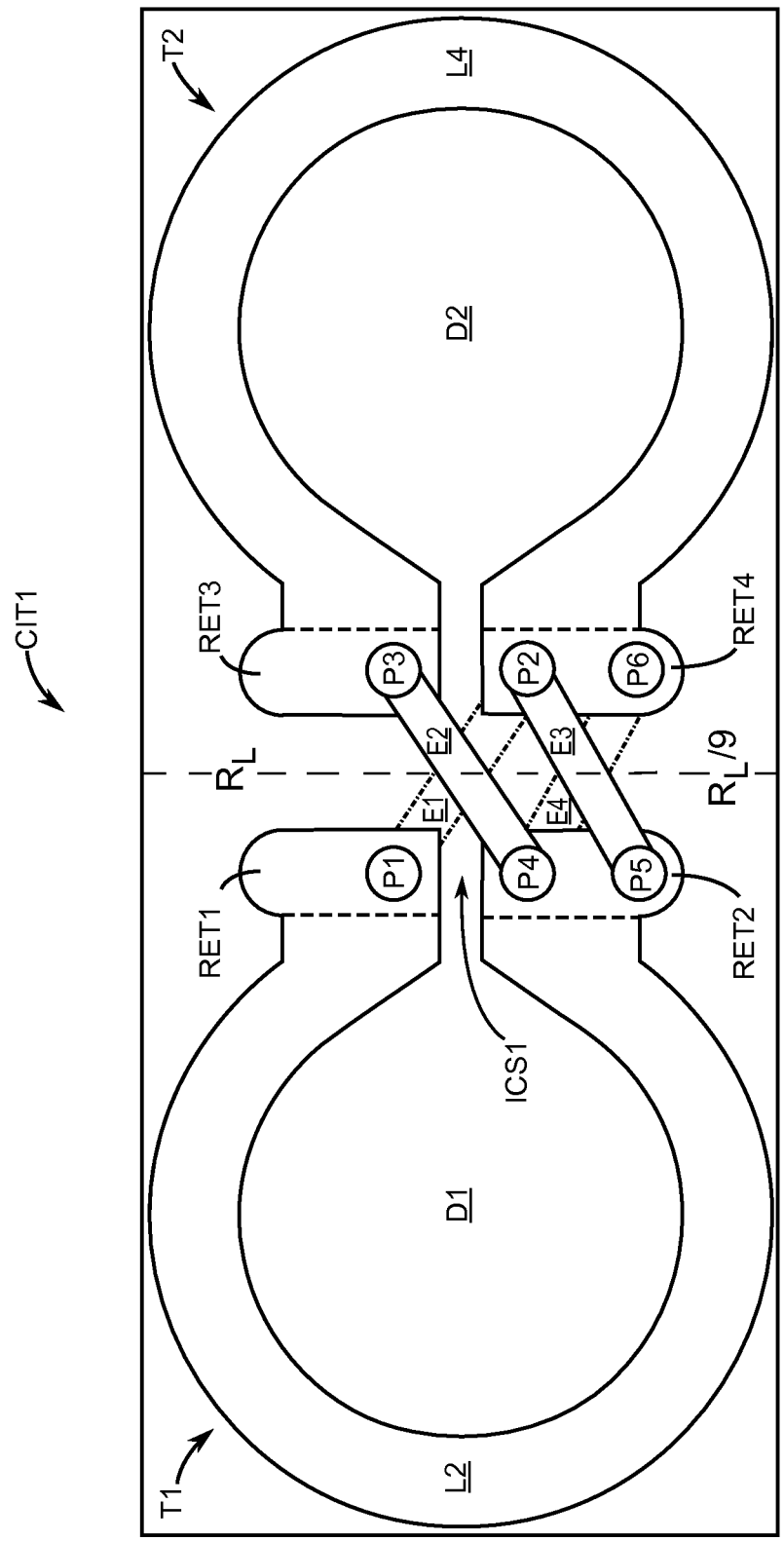
FIG. 5 is a bottom-side structural diagram of the embodiment of FIG. 4.
Figure 6:
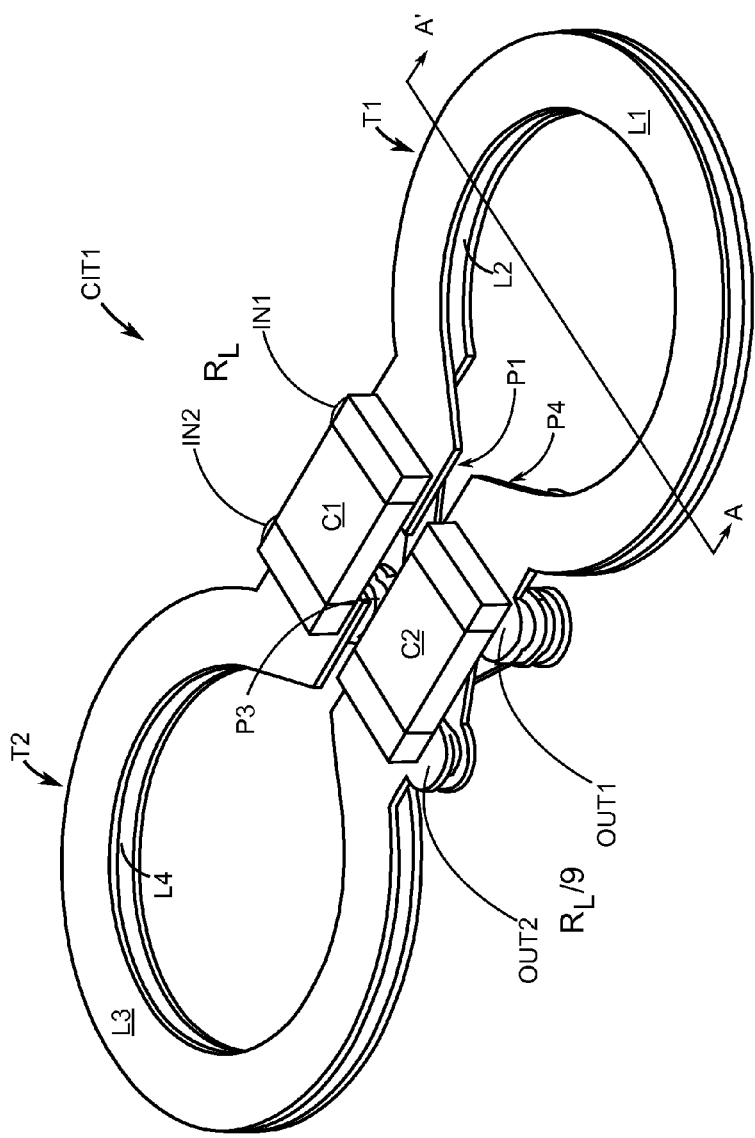
FIG. 6 is a three-dimensional structural diagram of the embodiment of FIGS. 4 and 5 having discrete capacitors coupled between input and output terminals.
Figure 7:
FIG. 7 is a sectional view of the embodiment of FIG. 6 taken along a section line A-A'.

As best seen in FIG. 5, a second planar conductor L2 is disposed on a bottom surface of the first dielectric substrate D1 in a second loop extending from a first return terminal RET1 to a second return terminal RET2. Referring now to FIG. 6 that depicts a three-dimensional structural diagram of the compact impedance transformer CIT1, the first planar conductor L1 and the second planar conductor L2 are substantially identical and in stacked alignment. FIG. 7 is a sectional view of the embodiment of FIG. 6 taken along a section line A-A' that shows the first dielectric substrate D1 residing between the first planar conductor L1 and the second planar conductor L2. The stacked alignment arrangement of the first planar conductor L1 and the second planar conductor L2 make up a first transmission line T1.

Referring back to FIG. 4, the compact impedance transformer CIT1, further includes a second dielectric substrate D2 with a third planar conductor L3 disposed on a top surface of the second dielectric substrate D2 in a third loop extending from a second input terminal IN2 to a second output terminal OUT2. As best seen in FIG. 5, a fourth planar conductor L4 is disposed on a bottom surface of the second dielectric substrate D2 in a fourth loop extending from a third return terminal RET3 to a fourth return terminal RET4. Referring now to FIG. 6, the third planar conductor L3 and the fourth planar conductor L4 are substantially identical and in stacked alignment with the second dielectric substrate D2 residing there between. The stacked alignment arrangement of the third planar conductor L3 and the fourth planar conductor L4 make up a second transmission line T2.

A dashed line drawn through the centers of FIG. 4 and FIG. 5 represent a boundary between the first dielectric substrate D1 and the second dielectric substrate D2. However, it is to be understood that the first dielectric substrate D1 and the second dielectric substrate D2 can be one continuous sheet. In another embodiment, described later and depicted in FIGS. 11 and 12, the first dielectric and the second dielectric are separate sheets.

A first capacitor C1 depicted symbolically in FIG. 4 couples the first input terminal IN1 to the second input terminal IN2. A second capacitor C2 depicted symbolically in FIG. 4 couples the first output terminal OUT1 to the second output terminal OUT2. The first capacitor C1 and the second capacitor C2 tune the first transmission line T1 and the second transmission line T2 such that the first planar conductor L1, the second planar conductor L2, the third planar conductor L3, and the fourth planar conductor L4 have reduced dimensions while maintaining a desirable characteristic impedance. The characteristic impedance of the first transmission line T1 and the second transmission line T2 is an important consideration for providing a relatively low insertion loss within any amplifier system in which the compact impedance transformer CIT1 is deployed.

The exemplary compact impedance transformer CIT1 depicted in FIGS. 4 to 8 is configured for 9:1 impedance transformation at an operational frequency of 1.8 GHz. As such, required transmission line characteristic impedance for the first transmission line T1 and the second transmission line T2 is 16.7Ω, which is equal to a geometric mean between 50Ω and 5.6Ω. Ordinarily, a microstrip implementation of this relatively low value of characteristic impedance would require prohibitively large dimensions for the transmission lines required to implement such an impedance transformer. In particular, a dimension of width for such a transmission line is too large to be practical for a typical handset power amplifier module.

A typical laminate stack-up comprising the first transmission line T1 and the second transmission line T2 has a line width of 450 μm for each of the first planar conductor L1, the second planar conductor L2, the third planar conductor L3, and the fourth planar conductor L4 in order to realize a 16.7Ω characteristic impedance for each of the first transmission line T1 and the second transmission line T2. In order to reduce the physical size requirement of each of the first transmission line T1 and the second transmission line T2, the first capacitor C1 and the second capacitor C2 are discrete capacitors having capacitance values that effectively lower the characteristic impedance of the first transmission line T1 and the second transmission line T2.

In this regard, the exemplary compact impedance transformer CIT1 depicted in FIGS. 4 to 8 has a length L=3.8 mm and width W=1.4 mm. A line width LW for each of the first planar conductor L1, the second planar conductor L2, the third planar conductor L3, and the fourth planar conductor L4 is a relatively small, being around 200 μm. Thus, the compact impedance transformer CIT1 has dimensions that are relatively small, which makes the compact impedance transformer CIT1 small enough to be usable within a typical handset module. In this exemplary embodiment depicted in FIGS. 4 to 8, the first capacitor C1 has a capacitance value of around 1.9 pF, and the second capacitor C2 has a capacitance value of around 3.6 pF. Moreover, as depicted in FIG. 6, the first capacitor C1 and the second capacitor C2 can be surface-mount components.

FIGS. 4 to 8 depict an interconnect structure ICS1 that couples between terminals of the first planar conductor L1, the second planar conductor L2, the third planar conductor L3, and the fourth planar conductor L4. The interconnect structure ICS1 is configurable for fixed impedance transformations. The interconnect structure ICS1 depicted in FIGS. 4 to 8 is particularly configured to provide a 9:1 impedance transformation ratio. In this particular case and as best seen in FIG. 4 and FIG. 5, a first electrical interconnector E1 couples a first point P1 located on the second planar conductor L2 proximal to the first input terminal IN1 to a second point P2 located on the fourth planar conductor L4 proximal to the second output terminal OUT2. A second electrical interconnector E2 couples a third point P3 located on the fourth planar conductor L4 proximal to the second input terminal IN2 to a fourth point P4 located on the second planar conductor L2 proximal to the first output terminal OUT1. A third electrical interconnector E3 couples the second point P2 to a fifth point P5 that is electrically common with the first output terminal OUT1. A fourth electrical interconnector E4 couples the fourth point P4 to a sixth point P6 that is electrically common with the second output terminal OUT2. In this particular configuration, an input load impedance $R_L$ is transformed to an output load impedance of $R_L/9$, which is the 9:1 impedance transformation ratio. Other electrical interconnections configurable using the interconnection structure provide different impedance ratios, such as 2.25:1, 4:1, and 6.25:1. However, it is to be understood that these impedance transformation ratios are only exemplary and other fixed impedance ratios typical for traditional transmission line transformers are provided by the present embodiments.

Figure 8:
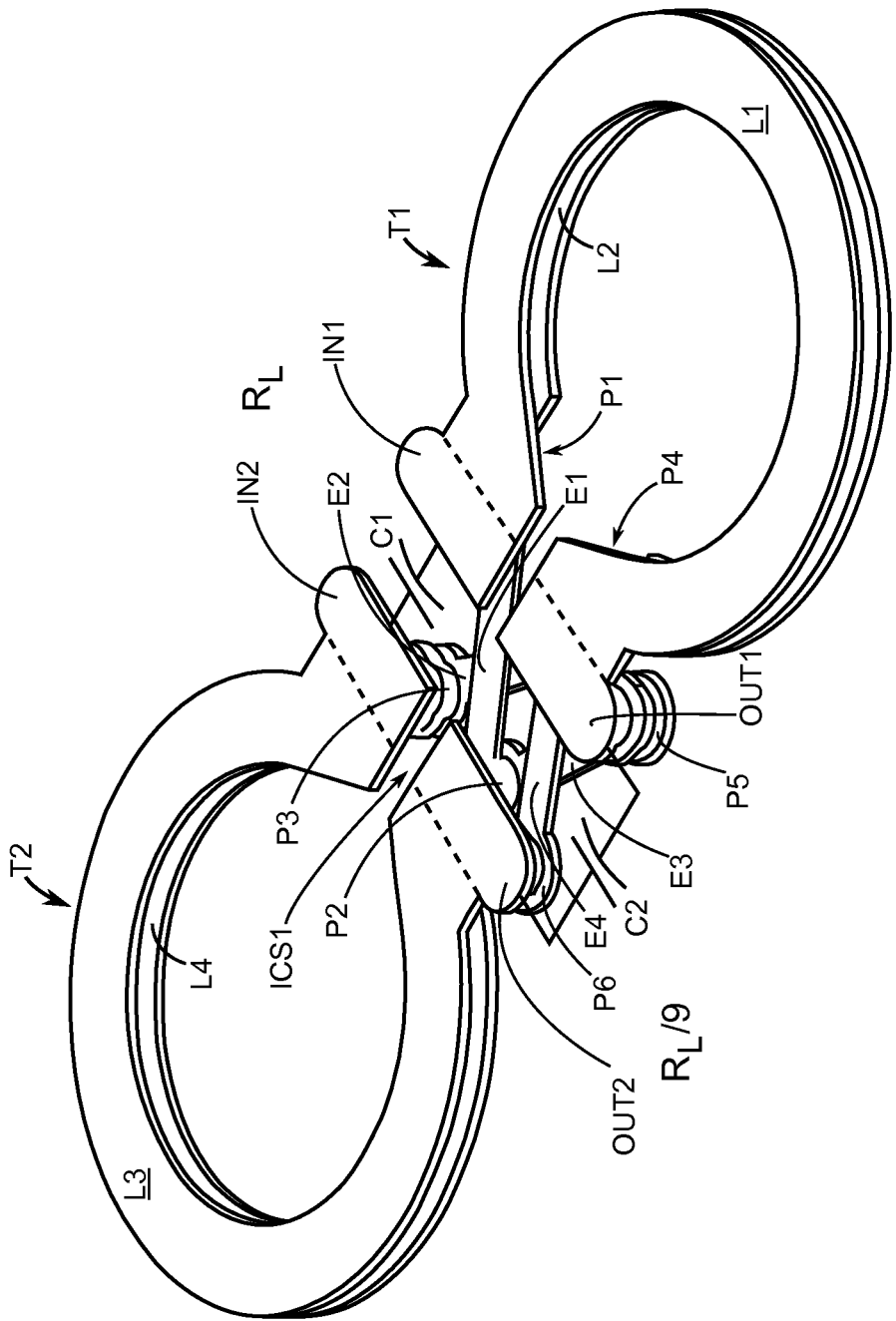
FIG. 8 is a three-dimensional structural diagram of the embodiment of FIGS. 4 and 5 with the discrete capacitors removed to better show an electrical interconnect structure.

FIG. 8 is a three-dimensional structural diagram of the embodiment of FIGS. 4 to 6 with the first capacitor C1 and the second capacitor C2 removed and replaced with capacitor symbols to better show an interconnect structure ICS1. The first dielectric substrate D1 (FIG. 4) and the second dielectric substrate D2 (FIG. 4) are also removed to better show the interconnect structure ICS1.

Figure 9:
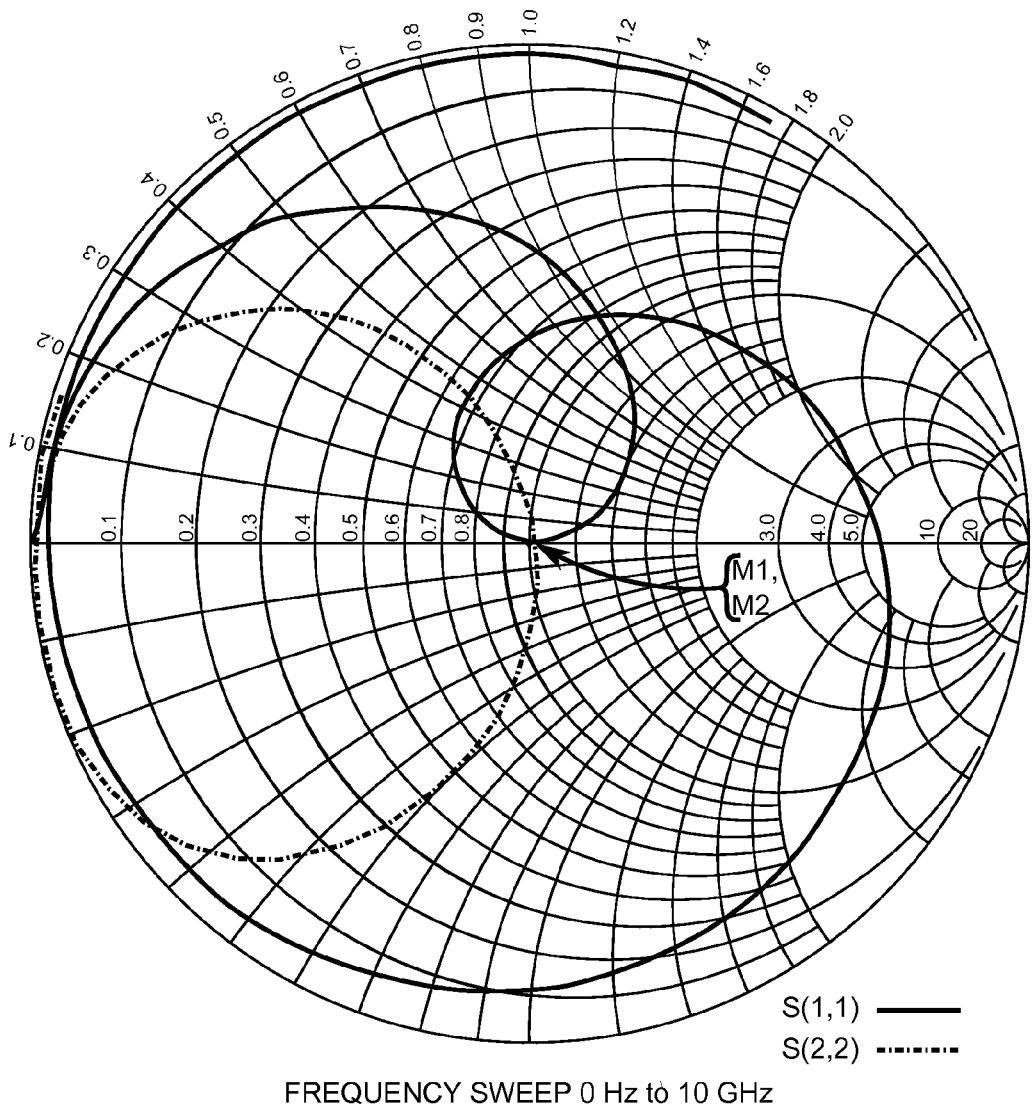
FIG. 9 is a Smith chart for the simulated impedance transformation performance of the compact transformer embodiment depicted in FIGS. 4 to 8.

FIG. 9 is a Smith chart for the simulated impedance transformation performance of the compact transformer embodiment depicted in FIGS. 4 to 8. A scattering parameter S(1,1) is depicted as a solid trace looping through the Smith chart. The scattering parameter S(1,1) is associated with an input voltage reflection coefficient for an RF signal reflection from the first input terminal IN1 and the second input terminal IN2. A scattering parameter S(2,2) is depicted as a dashed trace looping through the Smith chart. The scattering parameter S(2,2) is associated with an input voltage reflection coefficient for an RF signal reflection from the first output terminal OUT1 and the second output terminal OUT2. A frequency sweep from 0 Hz to 10 GHz generates both the solid trace for the scattering parameter S(1,1) and the dashed trace for the scattering parameter S(2,2). A marker M1 for the operational frequency of 1.8 GHz shows that reflected RF power is relatively extremely low, having a scattering parameter S(1,1) input reflection coefficient of 0.008. A marker M2 for the operational frequency of 1.8 GHz shows that reflected RF power is relatively very low, having a scattering parameter S(2,2) output reflection coefficient of 0.019. Moreover, a terminating impedance of 50Ω is transformed to an impedance of 5.87Ω and is associated with the scattering parameter S(1,1). Another terminating impedance of 5.556Ω is transformed to 50.8Ω and is associated with the scattering parameter S(2,2).

Figure 10:
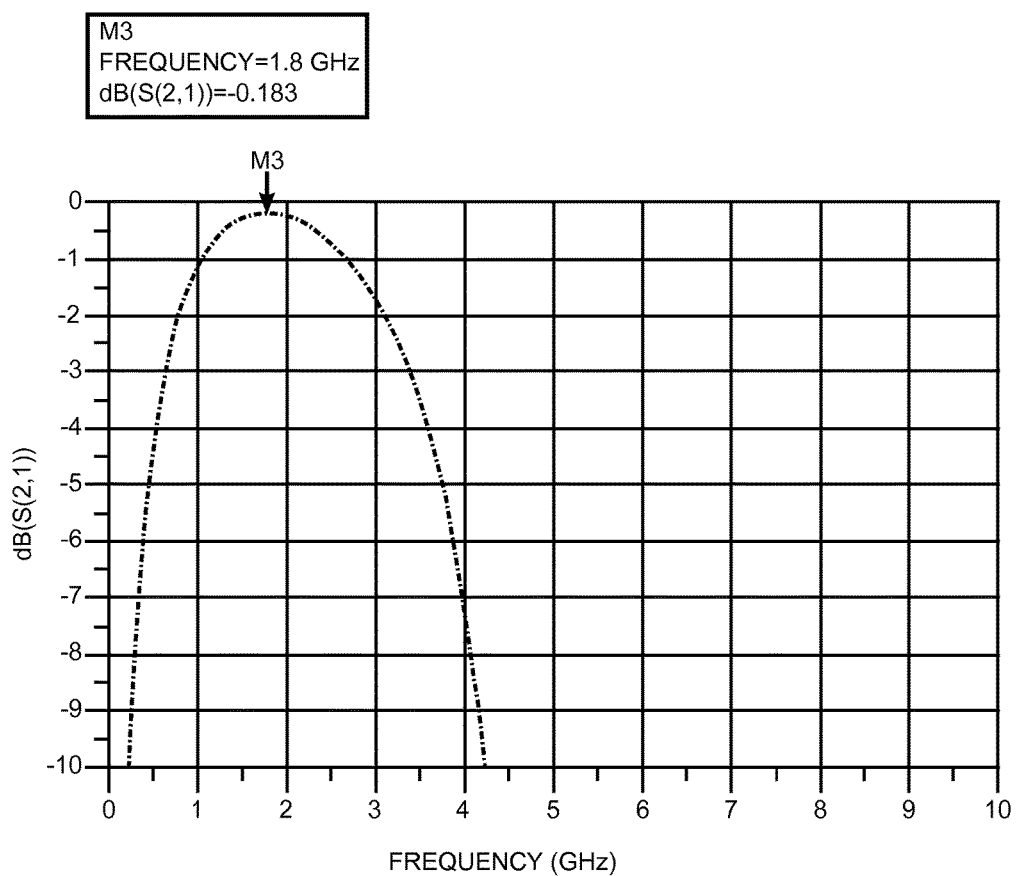
FIG. 10 is a simulated insertion loss versus frequency graph for the compact transformer embodiment depicted in FIGS. 4 to 8.

FIG. 10 is a simulated insertion loss versus frequency graph for the compact impedance transformer CIT1 embodiment depicted in FIGS. 4 to 8. An insertion loss for the compact impedance transformer CIT1 is calculated to be less than around 0.2 dB. An insertion loss this low allows the output impedance of the compact impedance transformer CIT1 to match the input impedance of a power amplifier while maintaining a relatively high power efficiency. A 0.5 dB bandwidth is roughly 1.3 GHz for the compact impedance transformer when operated at a center frequency of 1.8 GHz. Other impedance configurations give insertion losses that range from around 0.14 dB to around 0.55 dB.

Figure 11:
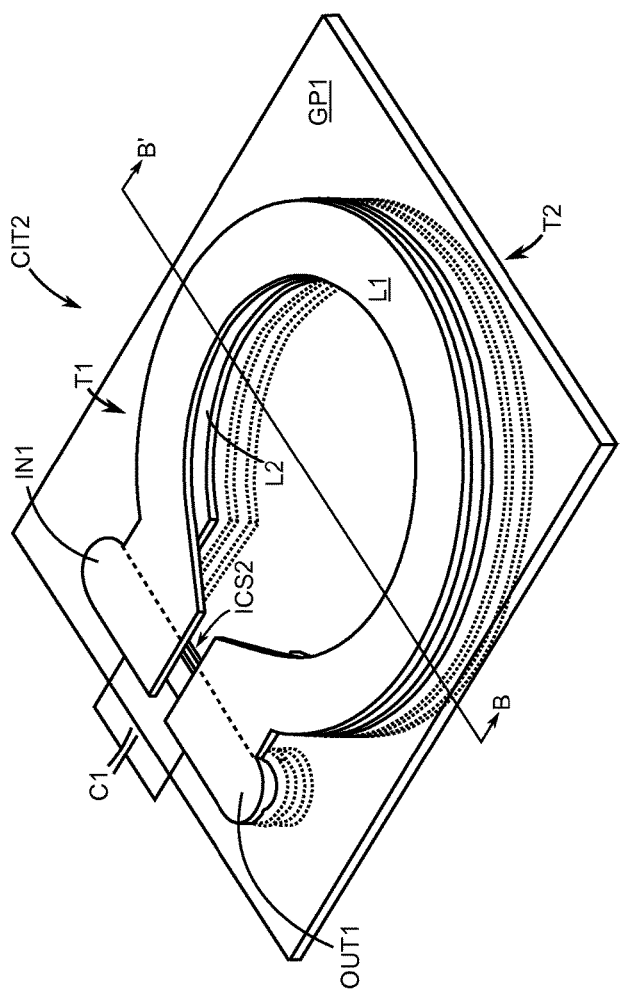
FIG. 11 is a three-dimensional structural diagram of a reduced area embodiment in which a first and a second transmission line are aligned and vertically stacked.
Figure 12:
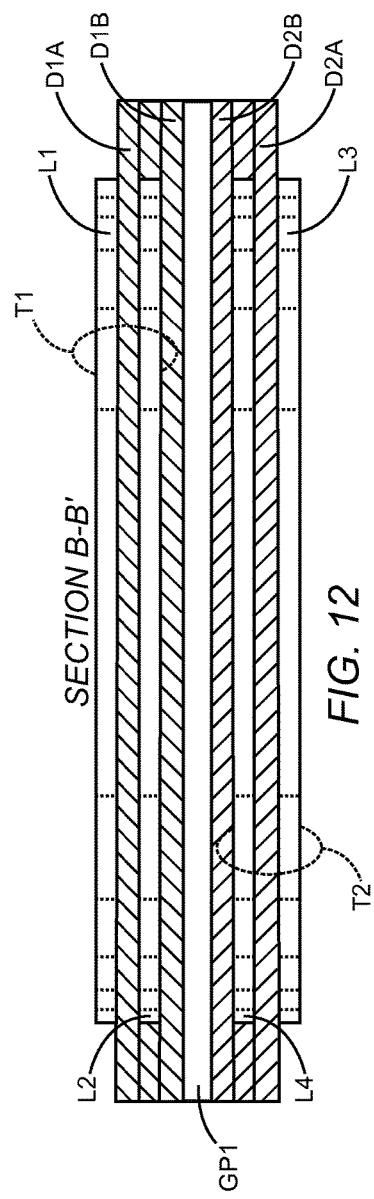
FIG. 12 is a sectional view of the embodiment of FIG. 11 taken along a section line B-B'.

FIG. 11 and FIG. 12 depict a reduced area embodiment of a compact impedance transformer CIT2. In particular, FIG. 11 is a three-dimensional structural diagram of the compact impedance transformer CIT2 in which the first transmission line T1 and the second transmission line T2 are aligned and vertically stacked. A ground plane GP1 separates the first transmission line T1 from the second transmission line T2, which is shown in dashed line. An interconnect structure ICS2 coupled between terminals of the first planar conductor L1, the second planar conductor L2, the third planar conductor L3, and the fourth planar conductor L4 provides impedance transformations.

FIG. 12 is a sectional view of the embodiment of FIG. 11 taken along a section line B-B'. A first-first dielectric substrate D1A separates the first planar conductor L1 from the second planar conductor L2. A second-first dielectric D1B separates the second planar conductor L2 from the ground plane GP1. A first-second dielectric substrate D2A separates the third planar conductor L3 from the fourth planar conductor L4. A second-second dielectric substrate D2B separates the fourth planar conductor L4 from the ground plane GP1. An interconnection structure ICS2 is configurable to electrically connect particular combinations of the first planer conductor L1, the second planar conductor L2, the third planar conductor L3, and the fourth planar conductor L4 in order to achieve a desired impedance transformation ratio. For example, the same electrical connections required for the 9:1 impedance ratio provided by the compact impedance transformer CIT1 of FIGS. 4 to 8 are required for a 9:1 impedance ratio provided by the second embodiment that is the compact impedance transformer CIT2.

Figure 13:
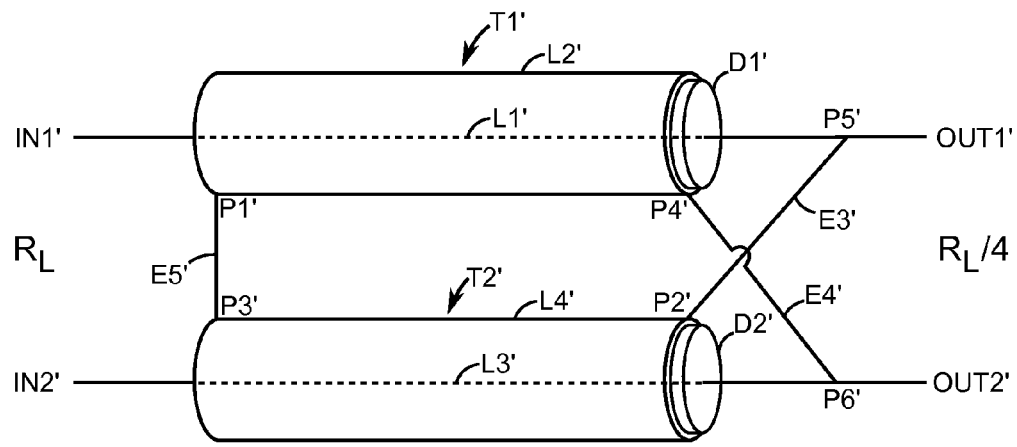
FIG. 13 is a diagram of a transmission line transformer that provides a 4:1 impedance transformation.

FIG. 13 is a diagram of a transmission line transformer that provides a 4:1 impedance transformation. FIG. 13 is an aid for the discussion of FIG. 14, which is a top-side structural diagram of one embodiment of a compact impedance transformer CIT3 that is electrically configured similar to the transmission line transformer of FIG. 13. The primed element numbers of FIG. 13 represent similar items and references in FIG. 14. For example, the element number L1 in FIG. 14 is functionally similar to element number L1' shown in FIG. 13.

Figure 14:
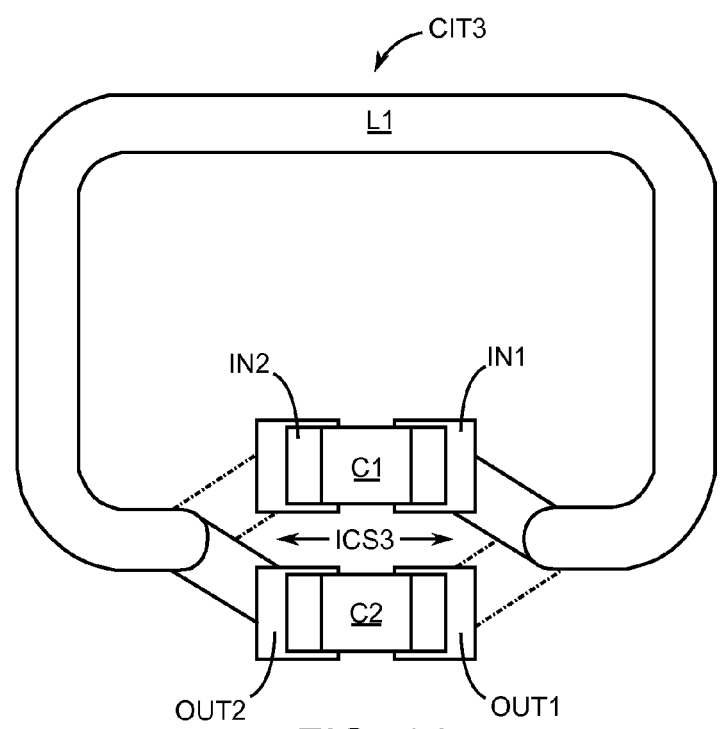
FIG. 14 is a top-side structural diagram of a reduced-area embodiment of a compact impedance transformer similar to the embodiment of FIG. 11, but in this case having a 4:1 impedance transformation ratio provided by the electrical connections of FIG. 13.

FIG. 14 is a reduced-area embodiment of the compact impedance transformer CIT3, which is folded like the embodiment of FIG. 11, but in this case, the first planar conductor L1 is relatively square. The second planar conductor L2, the third planar conductor L3, and the fourth planar conductor L4 are not visible in this view because they are directly underneath the first planar conductor L1. Further still, the first planar conductor L1, the second planar conductor L2, the third planar conductor L3, and the fourth planar conductor L4 are substantially identical and in stacked alignment. In this exemplary case, an interconnect structure ICS3 is configured to provide a fixed 4:1 impedance transformation ratio.

Referring back to FIG. 13, the interconnect structure ICS3 (FIG. 14) makes electrical connections that couple the second point P2' to the fifth point P5' via the third electrical interconnector E3, and couples the fourth point P4' to the sixth point P6' via the fourth electrical interconnector E4'. A fifth electrical interconnector E5' couples the first point P1' to the third point P3'.

Figure 15:
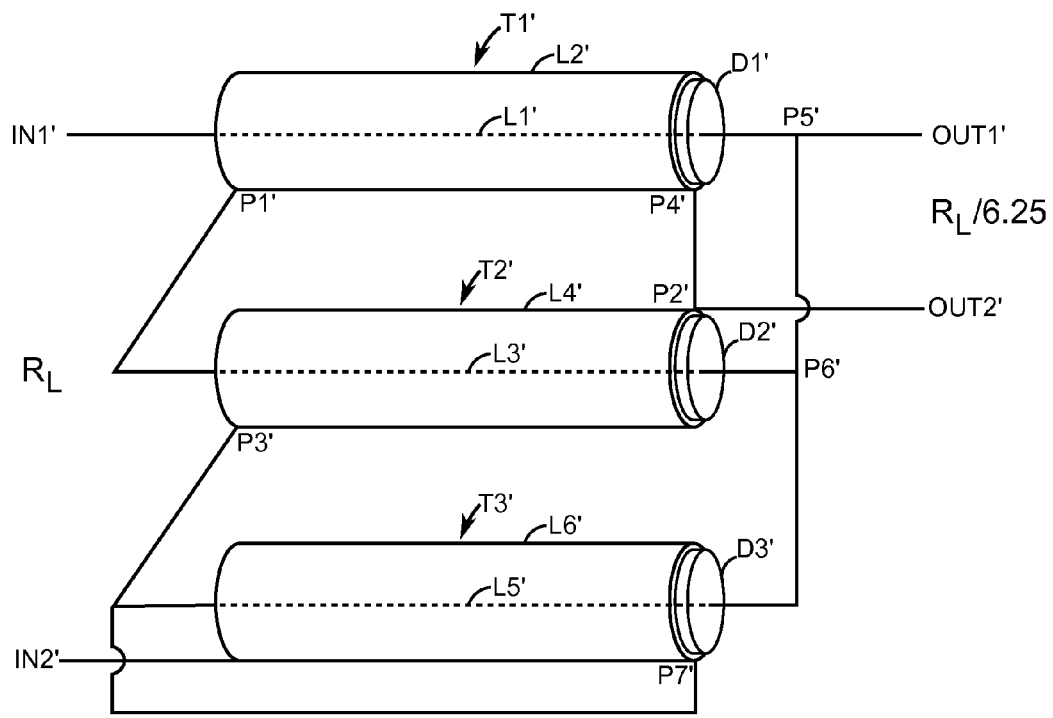
FIG. 15 is a diagram of a transmission line transformer that provides a 6.25:1 impedance transformation.

FIG. 15 is a diagram of a transmission line transformer that provides a 6.25:1 impedance transformation. FIG. 15 is an aid for the discussion of FIG. 16, which is a top-side structural diagram of one embodiment of a compact impedance transformer CIT4 that is electrically configured similar to the transmission line transformer of FIG. 15. The primed element numbers of FIG. 15 represent similar items and references in FIG. 16. For example, the element number L1 in FIG. 14 is functionally similar to element number L1' shown in FIG. 15.

Figure 16:
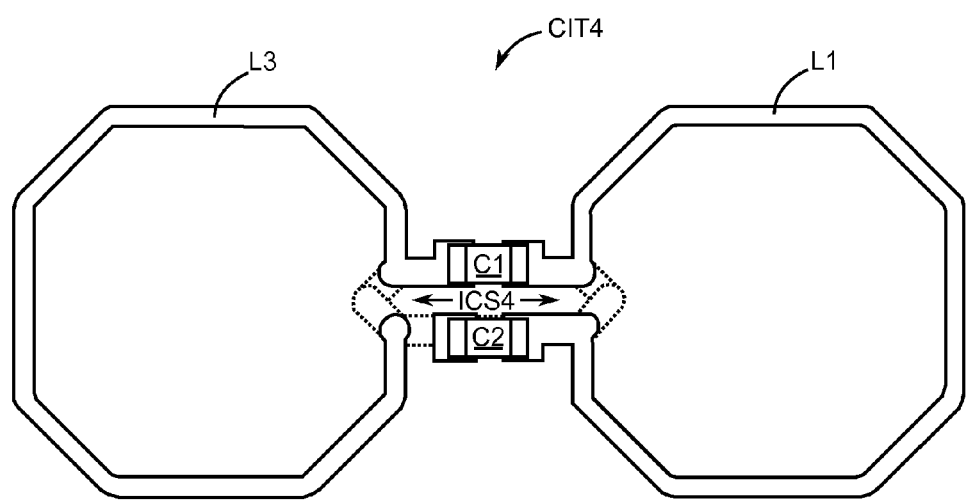
FIG. 16 is a top-side structural diagram of one embodiment of a compact impedance transformer that is electrically configured similar to the transmission line transformer of FIG. 15.

In particular, FIG. 16 is a top-side structural diagram of one embodiment of the compact impedance transformer CIT4 that is electrically configured similar to the transmission line transformer of FIG. 15. An interconnect structure ICS4 is configured to provide a fixed 6.25:1 impedance transformation ratio. Referring back to FIG. 15, the interconnect structure ICS4 (FIG. 16) makes electrical connections that couples the first point P1' to the second center conductor L3' that is proximal to the first point P1'. Moreover, the second point P2' is coupled to the fourth point P4', and the fifth point P5' is coupled to the sixth point P6', which is coupled to the second center conductor L3' proximal to the sixth point P6'. A third transmission line T3' includes a third center conductor L5' that is separated from a third outer conductor L6' by a third dielectric D3'. The sixth point P6' is further coupled to the third center conductor L5' proximal to the sixth point P6'. A seventh point P7' is coupled to the third point P3' and to the third center conductor L5' proximal to the third point P3'. In this particular case, the second output terminal OUT2' is coupled to the second outer conductor L4', and the second input IN2' is coupled to the third outer conductor L6'.

Referring to FIG. 16, the first planar conductor L1 and the third planar conductor L3 are more octagonal shaped as opposed to circular. The second planar conductor L2 and the fourth planar conductor L4 are not visible in this view because they are directly underneath the first planar conductor L1 and the third planar conductor L3, respectively. In this case, the first planar conductor L1, the second planar conductor L2, the third planar conductor L3, and the fourth planar conductor L4 are substantially identical and in stacked alignment. A fifth planar conductor and a sixth planar conductor are also not visible in this view because they are beneath the first planar conductor and the second planar conductor.

FIG. 17 and the FIG. 18 provide views of features not visible in FIG. 16. The views of features include the second planar conductor L2, the fourth planar conductor L4, the fifth planar conductor L5, and the sixth planar conductor L6. In particular, FIG. 17 is a three-dimensional structural diagram of the embodiment depicted in FIG. 16, and FIG. 18 is a sectional view of the embodiment of FIG. 17 taken along a section line C-C'. FIG. 18 shows the first-first dielectric substrate D1A that separates the first planar conductor L1 from the second planar conductor L2, along with the second-first dielectric D1B that separates the second planar conductor L2 from the ground plane GP1. A first-third dielectric substrate D3A separates the fifth planar conductor L5 from the sixth planar conductor L6. A second-third dielectric substrate D3B separates the sixth planar conductor L6 from the ground plane GP1.

Figure 19:
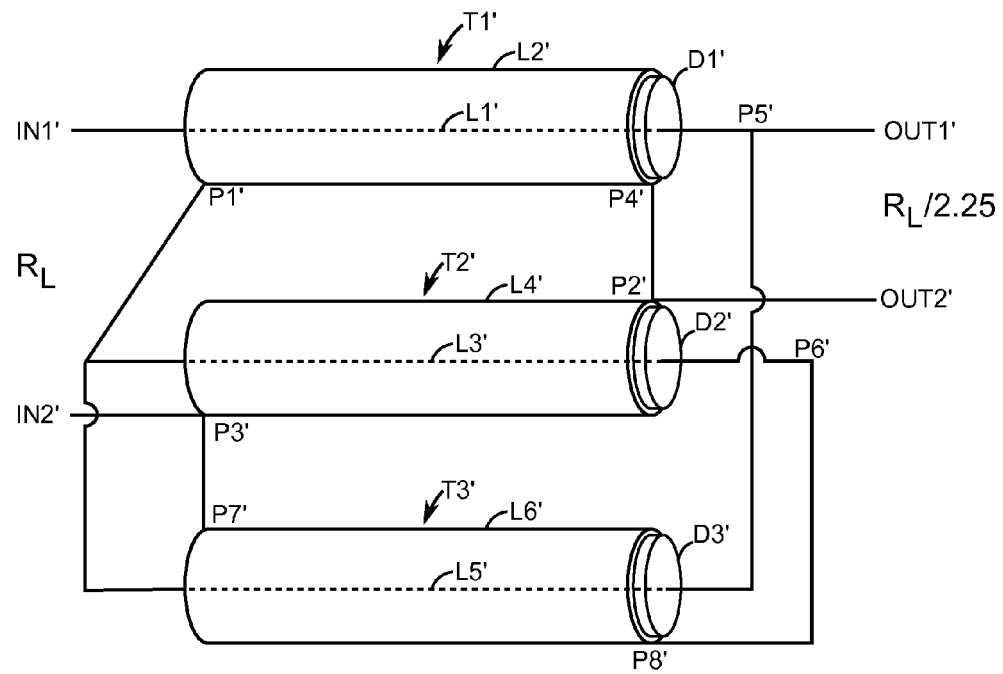
FIG. 19 is a diagram of a transmission line transformer that provides a 2.25:1 impedance transformation.
Figure 20:
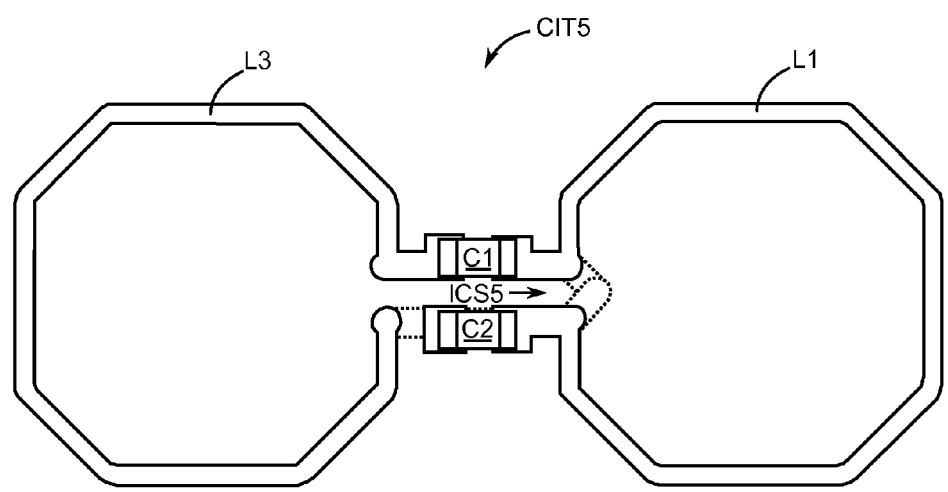
FIG. 20 is a top-side structural diagram of an embodiment of a compact impedance transformer that is electrically configured similar to the transmission line transformer of FIG. 19.

FIG. 19 is a diagram of a transmission line transformer that provides a 2.25:1 impedance transformation. FIG. 19 is an aid for the discussion of FIG. 20, which is a top-side structural diagram of one embodiment of a compact impedance transformer CIT5 that is electrically configured similar to the transmission line transformer of FIG. 19. The primed element numbers of FIG. 19 represent similar items and references in FIG. 20. For example, the element number L1' in FIG. 19 is functionally similar to element number L1 shown in FIG. 20.

Referring back to FIG. 19, the interconnect structure ICS5 (FIG. 20) makes electrical connections that couple the first point P1' to the third center conductor L5' proximal to the second input terminal IN2' and the second point P2' to the fourth point P4'. Moreover, the fifth point P5' is coupled to the third center conductor L5' proximal to the second output terminal OUT2'. The sixth point P6' is coupled to the third outer conductor L6' via an eighth point P8'. The seventh point P7' is coupled to the third point P3' proximal to the second input terminal IN2'. In this particular case, the second output terminal OUT2' is coupled to the second point P2' on the second outer conductor L4', and the second input terminal IN2' is coupled to the third point P3' on the second outer conductor L4'.

FIG. 21 is a table providing capacitance values for the discrete first capacitor C1 and the second capacitor C2, the operating frequency F0 of each of the exemplary compact impedance transformers, an associated insertion loss, and the size of the exemplary compact impedance transformers for various exemplary impedance transformation ratios. In particular, a capacitance value for the discrete capacitor C1 ranges from around 0.4 pF to around 3 pF, whereas a capacitance value for the discrete capacitor C2 ranges from none to around 6.5 pF. The frequency of operation F0 for the exemplary embodiments ranges from around 900 MHz to around 3600 MHz. The insertion loss for various embodiments integrated into a power amplifier module ranges from around 0.135 dB to 0.549 dB. The size of the exemplary embodiments ranges from 1750 µm by 1200 µm to 5240 µm by 2400 µm.

Those skilled in the art will recognize improvements and modifications to the embodiments of the present disclosure. All such improvements and modifications are considered within the scope of the concepts disclosed herein and the claims that follow.

What is claimed is:

1. A compact impedance transformer comprising:
   a first dielectric substrate;
   a first planar conductor disposed on a top surface of the first dielectric substrate in a first loop extending from a first-first terminal to a second-first terminal;
   a second planar conductor disposed on a bottom surface of the first dielectric substrate in a second loop extending from a first-second terminal to a second-second terminal, wherein the first planar conductor and the second planar conductor are substantially identical and in stacked alignment with the first dielectric substrate residing there between;
   a second dielectric substrate;
   a third planar conductor disposed on a top surface of the second dielectric substrate in a third loop extending from a first-third terminal to a second-third terminal;
   a fourth planar conductor disposed on a bottom surface of the second dielectric substrate in a fourth loop extending from a first-fourth terminal to a second-fourth terminal, wherein the third planar conductor and the fourth planar conductor are substantially identical and in stacked alignment with the second dielectric substrate residing there between; and an interconnect structure that couples select ones of the first-first terminal, the second-first terminal, the first-second terminal, the second-second terminal, the first-third terminal, the second-third terminal, the first-fourth terminal, and the second-fourth terminal to provide impedance transformation between an input port comprised of the first-first terminal and the first-third terminal, and an output port comprised of the second-first terminal and the second-third terminal such that there is no common current return path between the first planar conductor, the second planar conductor, the third planar conductor and the fourth planar conductor.

2. The compact impedance transformer of claim 1 wherein electrical connections made by the interconnect structure are arranged between the first planar conductor, the second planar conductor, the third planar conductor, and the fourth planar conductor to provide an impedance transformation ratio of 4 to 1.

3. The compact impedance transformer of claim 1 wherein electrical connections made by the interconnect structure are arranged between the first planar conductor, the second planar conductor, the third planar conductor, and the fourth planar conductor to provide an impedance transformation ratio of 9 to 1.

4. The compact impedance transformer of claim 1 further comprising:

a third dielectric substrate;

a fifth planar conductor disposed on a top surface of the third dielectric substrate in a fifth loop extending from a first-fifth terminal to a second-fifth terminal; and a sixth planar conductor disposed on a bottom surface of the third dielectric substrate in a sixth loop extending from a first-sixth terminal to a second-sixth terminal, wherein the fifth planar conductor and the sixth planar conductor are substantially identical and in stacked alignment with the third dielectric substrate residing there between.

5. The compact impedance transformer of claim 4 further including an interconnect structure that couples select ones of the first-first terminal, the second-first terminal, the first-second terminal, the second-second terminal, the first-third terminal, the second-third terminal, the first-fourth terminal, the second-fourth terminal, the first-fifth terminal, the second-fifth terminal, the first-sixth terminal, and the second-sixth terminal, to provide impedance transformation between an input port and an output port.

6. The compact impedance transformer of claim 5 wherein electrical connections made by the interconnect structure are arranged between the first planar conductor, the second planar conductor, the third planar conductor, the fourth planar conductor, the fifth planar conductor, and the sixth planar conductor to provide an impedance transformation ratio of 2.25 to 1.

7. The compact impedance transformer of claim 5 wherein electrical connections made by the interconnect structure are arranged between the first planar conductor, the second planar conductor, the third planar conductor, the fourth planar conductor, the fifth planar conductor, and the sixth planar conductor to provide an impedance transformation ratio of 6.25 to 1.

8. The compact impedance transformer of claim 4 further including a first discrete capacitor coupled between input terminals.

9. The compact impedance transformer of claim 8 wherein the first discrete capacitor has a capacitance value that ranges from around 0.4 pF to around 3.0 pF.

10. The compact impedance transformer of claim 4 further including a second discrete capacitor coupled between output terminals.

11. The compact impedance transformer of claim 10 wherein the second discrete capacitor has a capacitance value that ranges from around 0.5 pF to around 6.5 pF.

12. The compact impedance transformer of claim 1 wherein the first dielectric substrate is coplanar with the second dielectric substrate.

13. The compact impedance transformer of claim 1 wherein the first dielectric substrate and the second dielectric substrate are in stacked alignment and separated by a ground plane.

14. The compact impedance transformer of claim 4 wherein an insertion loss of the compact impedance transformer ranges from around 0.135 dB to around 0.549 dB.

15. The compact impedance transformer of claim 4 wherein a dimensions of the compact impedance transformer range in area from around 1750 μm by 1200 μm to around 5240 μm by 2400 μm.

16. The compact impedance transformer of claim 1 wherein a characteristic impedance for each of a first transmission line comprising the first planar conductor and the second planar conductor, and a second transmission line comprising the third planar conductor and the fourth planar conductor is around a geometric mean of an input impedance coupled between input terminals and an output impedance coupled between output terminals.

17. The compact impedance transformer of claim 1 wherein input terminals are adapted to couple to an impedance of around 50Ω, and output terminals are adapted to couple to an output impedance of around 5.6Ω.

18. The compact impedance transformer of claim 1 wherein input terminals are adapted to receive an RF signal having a center frequency that ranges from around 900 MHz to around 1800 MHz.

19. The compact impedance transformer of claim 1 wherein input terminals are adapted to receive an RF signal having a center frequency that ranges from around 1800 MHz to around 3600 MHz.

\* \* \* \* \*